(12) United States Patent  (10) Patent No.: US 8,154,343 B2
Moonen et al.  (45) Date of Patent: Apr. 10, 2012

(54) HIGH DYNAMIC RANGE LOW-POWER DIFFERENTIAL INPUT STAGE

(75) Inventors: Oswald Josef Moonen, Eindhoven (NL); Marc Lambertus Vlemmings, Eindhoven (NL); Arnold Hendrik Neelen, Eindhoven (NL)

(73) Assignee: NXP B.V., Eindhoven (NL)

( * ) Notice: Subject to any disclaimer, the term of this patent is extended or adjusted under 35 U.S.C. 154(b) by 592 days.

(21) Appl. No.: 11/814,561

(22) PCT Filed: Jan. 16, 2006

(86) PCT No.: PCT/IB2006/050154
§ 371 (c)(1),
(2), (4) Date: Oct. 28, 2009

(87) PCT Pub. No.: WO2006/077525
PCT Pub. Date: Jul. 27, 2006

(65) Prior Publication Data
US 2011/0096240 A1    Apr. 28, 2011

Related U.S. Application Data

(60) Provisional application No. 60/646,091, filed on Jan. 21, 2005.

(51) Int. Cl.
*H03F 3/45* (2006.01)
(52) U.S. Cl. .................... 330/252; 330/254; 330/283

(58) Field of Classification Search .......... 330/252–261; 327/359; 348/678, 707
See application file for complete search history.

(56) References Cited

U.S. PATENT DOCUMENTS

| | | | |
|---|---|---|---|
| 4,598,256 A | | 7/1986 | Kinkel |
| 5,157,559 A | * | 10/1992 | Gleason et al. ................ 360/46 |
| 5,278,700 A | | 1/1994 | Sutliff et al. |
| 5,329,189 A | | 7/1994 | Ushida et al. |
| 6,084,469 A | * | 7/2000 | Lorenz .......................... 330/252 |
| 6,664,853 B1 | * | 12/2003 | Sun et al. ...................... 330/253 |
| 6,870,404 B1 | * | 3/2005 | Maangat ........................ 327/65 |
| 7,088,980 B2 | * | 8/2006 | Otaka ........................... 455/323 |
| 2004/0082307 A1 | | 4/2004 | Hackl | |

FOREIGN PATENT DOCUMENTS

EP    1195899 A2    4/2002

* cited by examiner

*Primary Examiner* — Hieu Nguyen

(57) ABSTRACT

A low-power high dynamic range RF input stage (200) with a noiseless degeneration component, such as a capacitor (201), is provided. High dynamic range means a combination of low noise contribution by the stage (200) and a low level of intermodulation products occurring especially at high input levels. Low power means that the power consumption of a conventional input stage is about 5 times higher than the power consumption of the stage according to the invention, for the same noise, gain and distortion level. This new stage can be used in amplifiers, but also in the lower stage of double balanced mixers (300-400) commonly used in RF receivers, examples of which are applications, are provided.

18 Claims, 5 Drawing Sheets

HIGH DYNAMIC RANGE LOW-POWER DIFFERENTIAL INPUT STAGE

The present invention relates to a low-power differential input stage with a high dynamic range.

A typical differential input stage is illustrated in FIG. 1. The transistors 101 together form an amplifying stage. In order to achieve a low noise contribution, the internal base resistance value $R_b$ of the two transistors 101 has a low value (15Ω). Furthermore, the two degeneration resistors 102 of 15Ω between the emitters also have a low value to minimize their thermal noise contribution. The total noise is determined by the sum of the two internal base resistors $R_b$, the two resistors 102 between the emitters 104 and two times half the small signal internal emitter resistance.

$r_e = kT/qI_e$ where $I_e$ is the emitter current of one transistor of the transistors, for 5 mA emitter current per transistor $r_e$ equals 5Ω per transistor. Then the noise contribution per transistor 101 equals $r_e/2 = 2.5$Ω. All noise-contributing resistors add up to:

$(R_b + R_b + R_{102} + R_{102} + r_e/2 + r_e/2) = (15 + 15 + 15 + 15 + 2.5 + 2.5)Ω = 65Ω.$

This results in a noise figure (NF), which is less than 3 dB. The 10 mA tail current generates a DC voltage across the resistors 102 between the emitters, with a value of 75 mV per resistor 102. This is necessary to obtain a high $3^{rd}$ order input intercept point (known as IP3) value of 118 dBμV (peak). The differential voltage gain $A_v$ achieved by the stage is equal to the ratio of twice the collector resistance 103 to the total emitter resistance:

$A_v = (50+50)/(5+15+15+5) = 2.5.$

A disadvantage of the prior art is that a high dynamic range can only be achieved at the expense of high power consumption. A circuit is desired that reduces this power consumption substantially while maintaining the same level of noise, gain and distortion performance.

The system and method of the present invention provide a high dynamic range low-power differential input stage.

A high dynamic range means a combination of:
a) low-noise contribution by the stage; and
b) a low level of inter-modulation products occurring especially at high input signal levels (this is equivalent to a high $3^{rd}$ order input intercept point, IP3).

Low power means that the power consumption of a conventional input stage is about 5 times higher than the power consumption of the system and method of the present invention for the same performance level.

In a preferred embodiment, emitter degeneration is achieved by a capacitor between the emitters instead of two resistors. Then the emitter current can be 5 times lower while the differential voltage gain remains unchanged.

Therefore, an input stage according to the invention requires only about one fifth of the current power consumption of a conventional input stage having the same performance. This energy saving is especially important for mobile and portable battery-fed equipment such as wireless LAN transceivers.

It is to be understood by persons of ordinary skill in the art that the following descriptions are provided for purposes of illustration and not for limitation. An artisan understands that there are many variations that lie within the spirit of the invention and the scope of the appended claims. Unnecessary details of known functions and operations may be omitted from the current description so as not to obscure the present invention.

The system and method of the present invention provide a high dynamic range low-power differential input stage.

Figure 1:
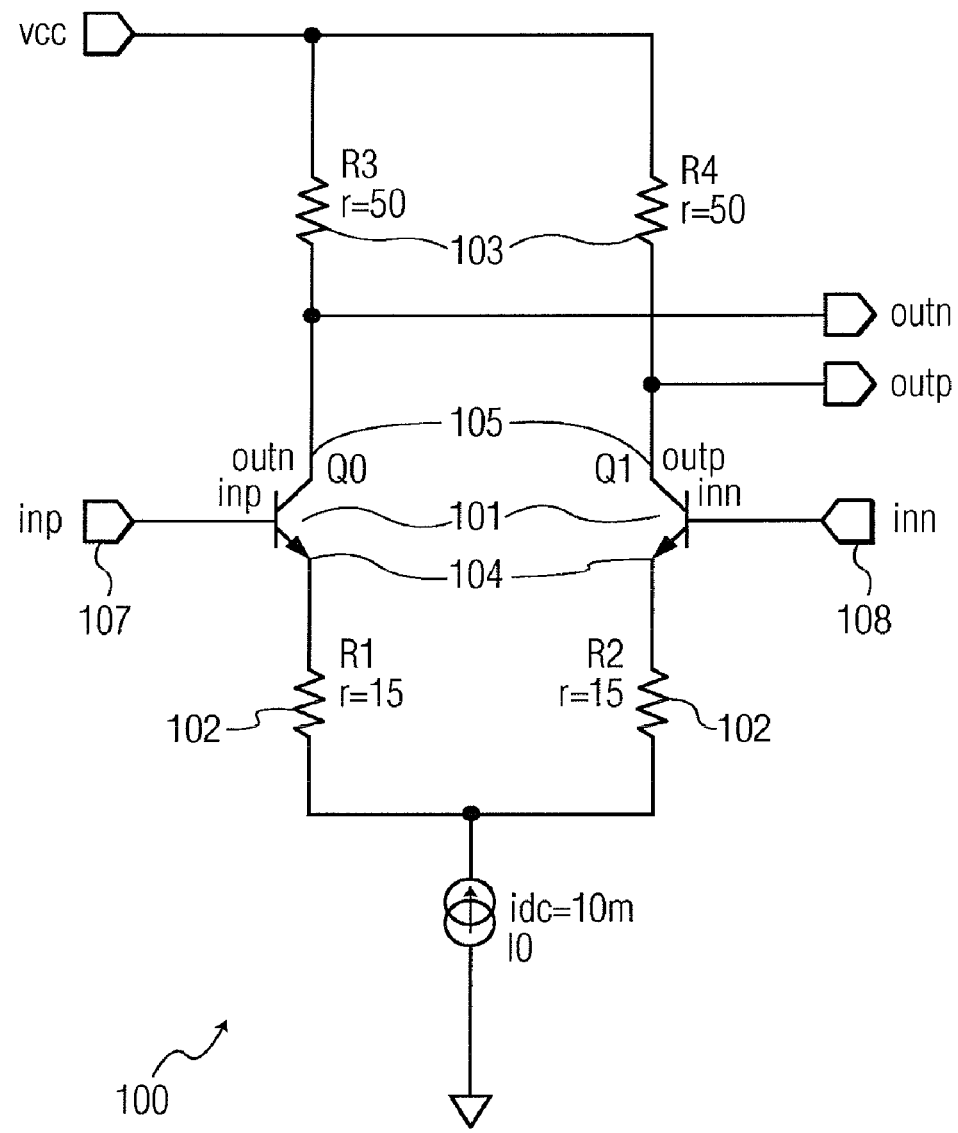
FIG. 1 illustrates a conventional differential input stage.
Figure 2:
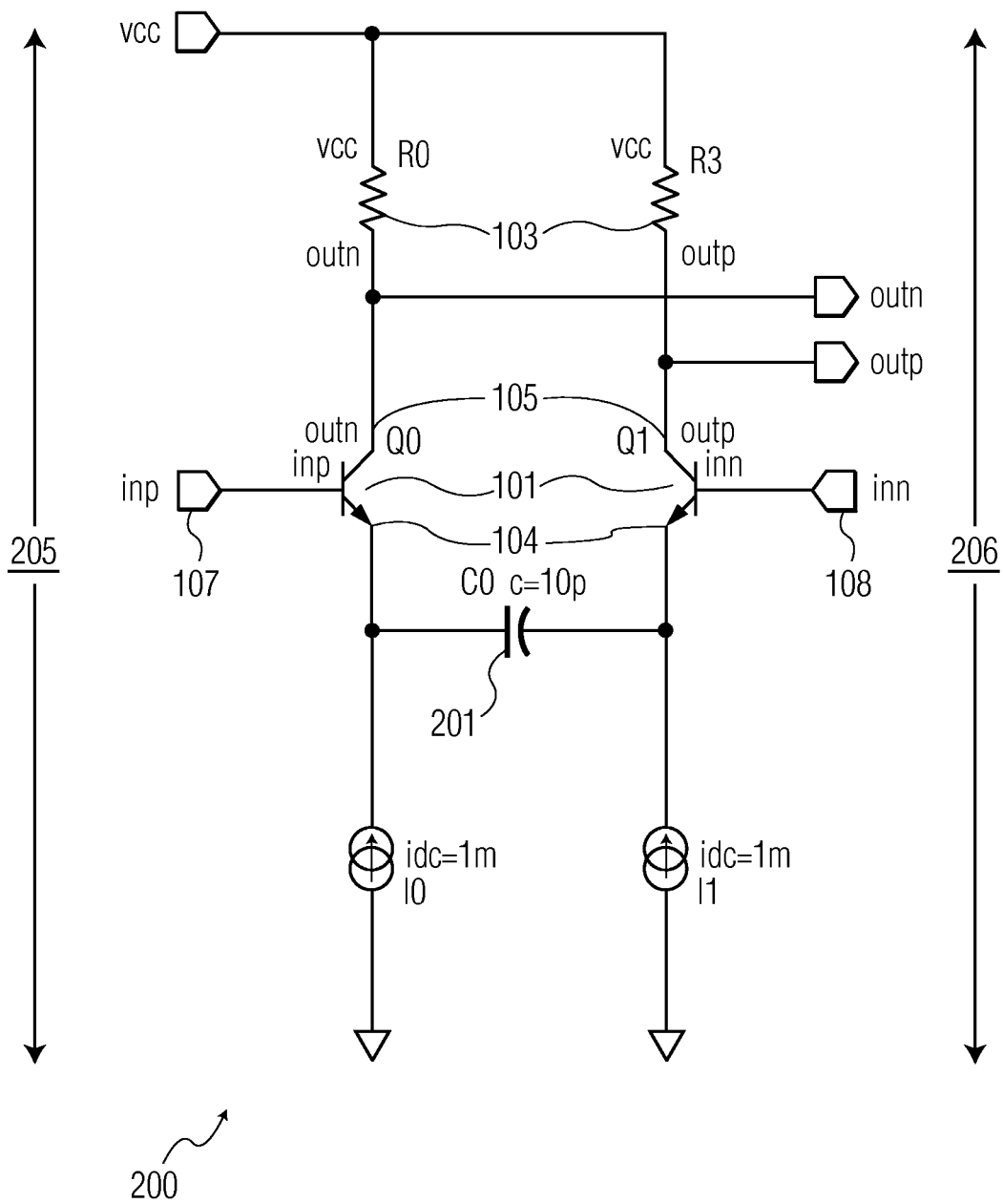
FIG. 2 illustrates a low-power high dynamic range differential input stage according to the present invention.

Referring now to FIG. 2, the transistors 101 are the same type as in the conventional input stage illustrated in FIG. 1. Consequently they have the same internal base resistance $R_b$ of 15Ω. The total tail current is:

$2 \times 1\text{mA} = 2\text{mA}$ instead of 10 mA in the conventional stage.

Emitter degeneration is achieved by a capacitor 201 between the emitters 104, instead of the two resistors 102. The value of this capacitor is in this example 10 pF and it contributes no noise to the circuit, assuming that the capacitor is lossless.

The noise is now determined by the sum of the two base resistors $R_b$ and two times half the small signal emitter resistance $r_e$ of the transistors. For 1 mA emitter current per transistor, $r_e$ is 25Ω. Therefore, the noise contribution per transistor is 12.5Ω. All noise-contributing resistors have a total value of:

$(15+15+12.5+12.5)Ω = 55Ω.$

This then results in nearly the same NF as the conventional input stage, which is less than 3 dB.

In order to obtain the same $3^{rd}$ order input intercept point of 118 dBμV (peak) as with the conventional amplifier stage, the product of the impedance between the emitters 104 multiplied by the tail current should be the same. In the conventional stage the impedance between the emitters 104 is 30Ω and the tail current is 10 mA. The impedance between the emitters 104 in the new stage of FIG. 2 is the reactance of 10 pF at a frequency of, e.g., 106 MHz, which amounts to 150Ω. This is 5 times more than in the conventional stage; however since the 2 mA emitter tail current is 5 times lower, this results in the same $3^{rd}$ order input intercept point of 118 dBμV (peak). The differential voltage gain $A_v$ remains unchanged, keeping in mind that the value of the collector resistors 103 has been increased from 50 Ohms to 250 Ohms:

$A_v = (250+250)/(25+150+25) = 2.5.$

The circuit according to the present invention can also be used to increase the dynamic range when the same tail current is used as in the conventional stage. The increase of the dynamic range is then partly achieved by a reduction of the NF. The resistors contributing the noise are now the internal base resistors $R_b$ and half of the $r_e$ of the transistors 101. With a 5 mA emitter current $r_e$ equals 5Ω, i.e., a 2.5 Ω noise contribution per transistor. All noise-contributing resistors now have a total value of:

$(15+15+2.5+2.5)Ω = 35Ω.$

This results in a lower NF. Also the $3^{rd}$ order input intercept point increases. It was 118 dBμV (peak) for the product of 2 mA and 10 pF (150Ω at 106 MHz), with 10 mA and 10 pF the $3^{rd}$ order input intercept point increases to 136 dBμV (peak). So with a lower Noise Figure and a higher $3^{rd}$ order input intercept point the dynamic range has been increased.

Figure 3:
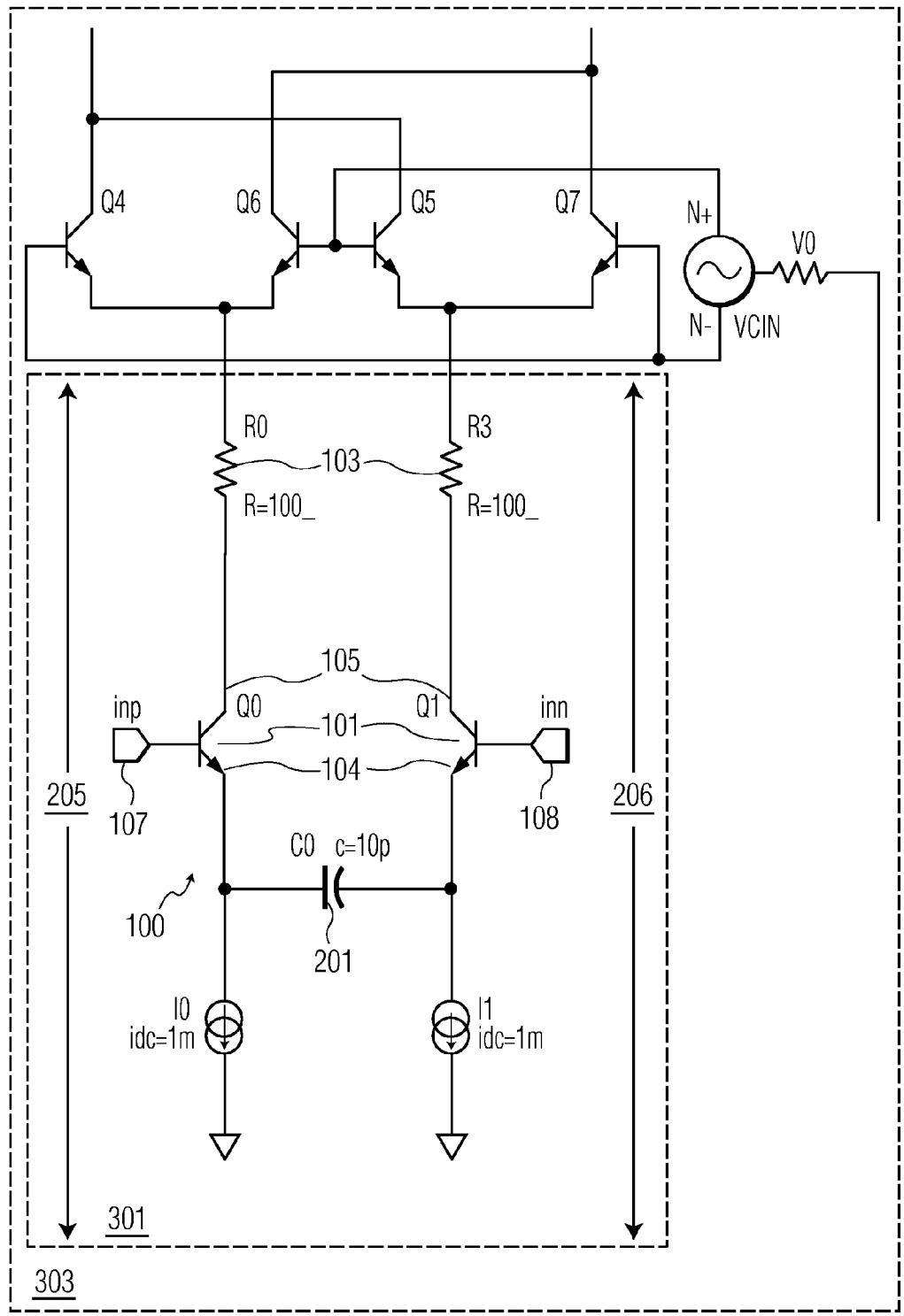
FIG. 3 illustrates an RF front end of an FM broadcast receiver modified according to the present invention.

Referring now to FIG. 3, illustrated therein is an RF front-end mixer of an FM broadcast receiver modified according to the present invention. FIG. 3 shows an RF front-end broadcast receiver, which receives RF signals between 87.5 MHz and 108.0 MHz The lower stage of a conventional mixer resembles the circuit of FIG. 1, with the exception of the resistors 103. The collectors of transistors 101 are then directly connected to the emitters of the upper stage. Now the lower stage 301 of the double balanced mixer 303 comprises a low-power high dynamic range input stage (as shown in FIG. 2) according to the present invention. The gain variation across the input frequency band is 1.85 dB; this variation is caused by the frequency-dependent reactance of capacitor 201. In order to avoid parasitic oscillations in the gain stage by the capacitive load of the emitters (due to the capacitor 201 between the emitters 104), two 100Ω resistors 103 have been connected in series with the collector leads 305.

In a conventional receiver the mixer is often preceded by a low-noise amplifier (LNA). The function of the LNA is to improve the noise figure of the receiver if the noise figure of the mixer is not good enough. The mixer according to the present invention may have such a low noise figure that the LNA can be omitted. If (due to the absence of the LNA) the gain in front of the mixer disappears, the IP3 requirement for this mixer can be reduced as well, resulting in additional power saving.

Figure 4:
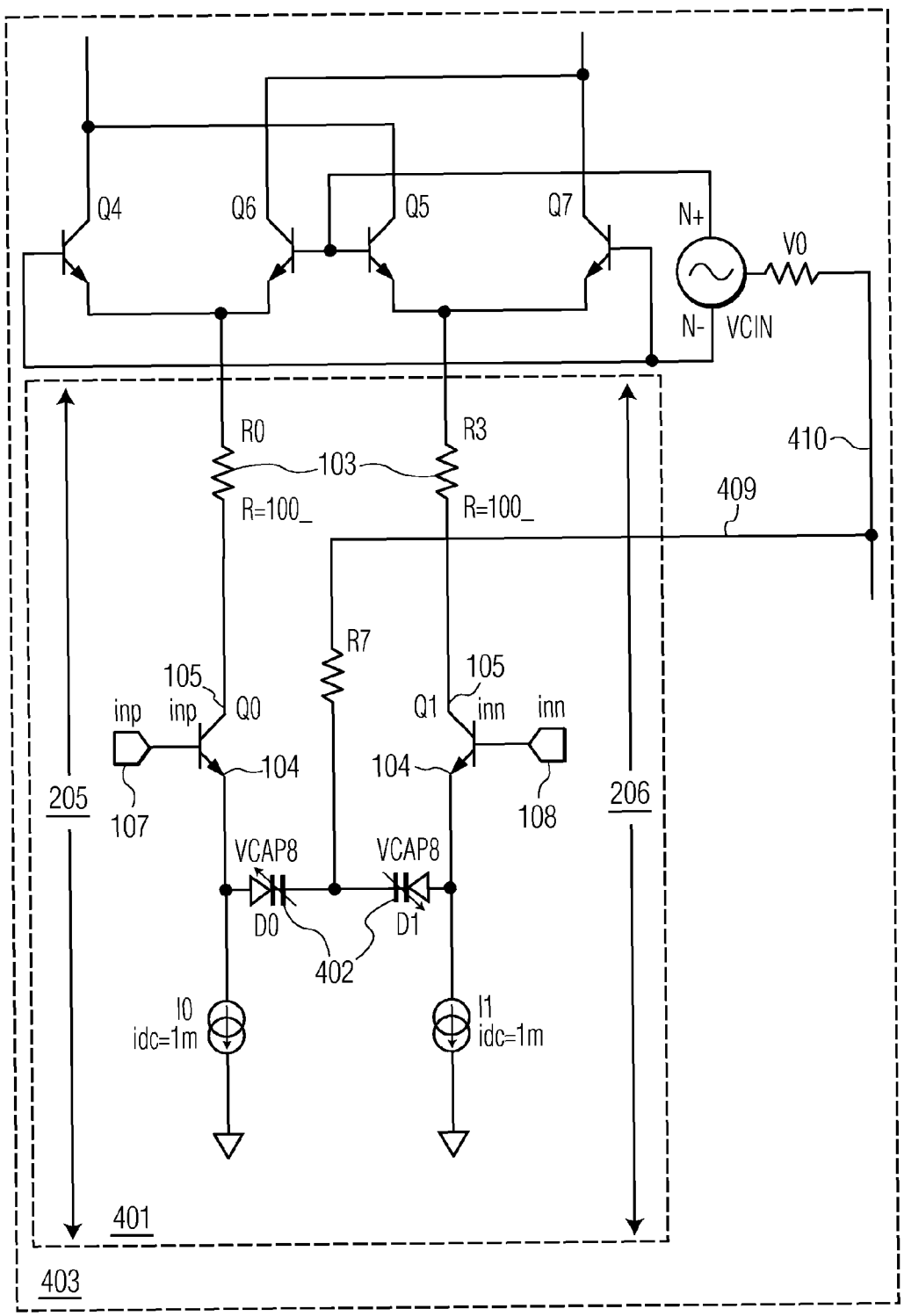
FIG. 4 illustrates a UHF part of a TV set modified according to the present invention.

Referring now to FIG. 4, illustrated therein is a UHF part of a television (TV) set. In the lower stage of the double balanced mixer 401 the new low-power high dynamic range input stage 401 of the present invention is used. Instead of the fixed value capacitor 201 between the emitters 104, two variable capacitance diodes 402 are applied to obtain a flat gain response across the UHF band from 470 MHz to 862 MHz. The control voltage for these variable capacitance diodes is the same as the tuning voltage $V_{TUNE}$ for the local oscillator driving the upper mixer stage. An increase of $V_{TUNE}$ will reduce the capacitance of the capacitance diodes 402, and consequently the gain can be kept constant across the frequency band. If, instead of the two variable capacitance diodes, a fixed capacitor is used, the gain variation across the UHF band would be 5.2 dB. In order to avoid parasitic oscillations in the gain stage by the capacitive load of the emitters 104, two 100Ω resistors 103 are connected in series with the collector leads of transistors 104.

Figure 5:
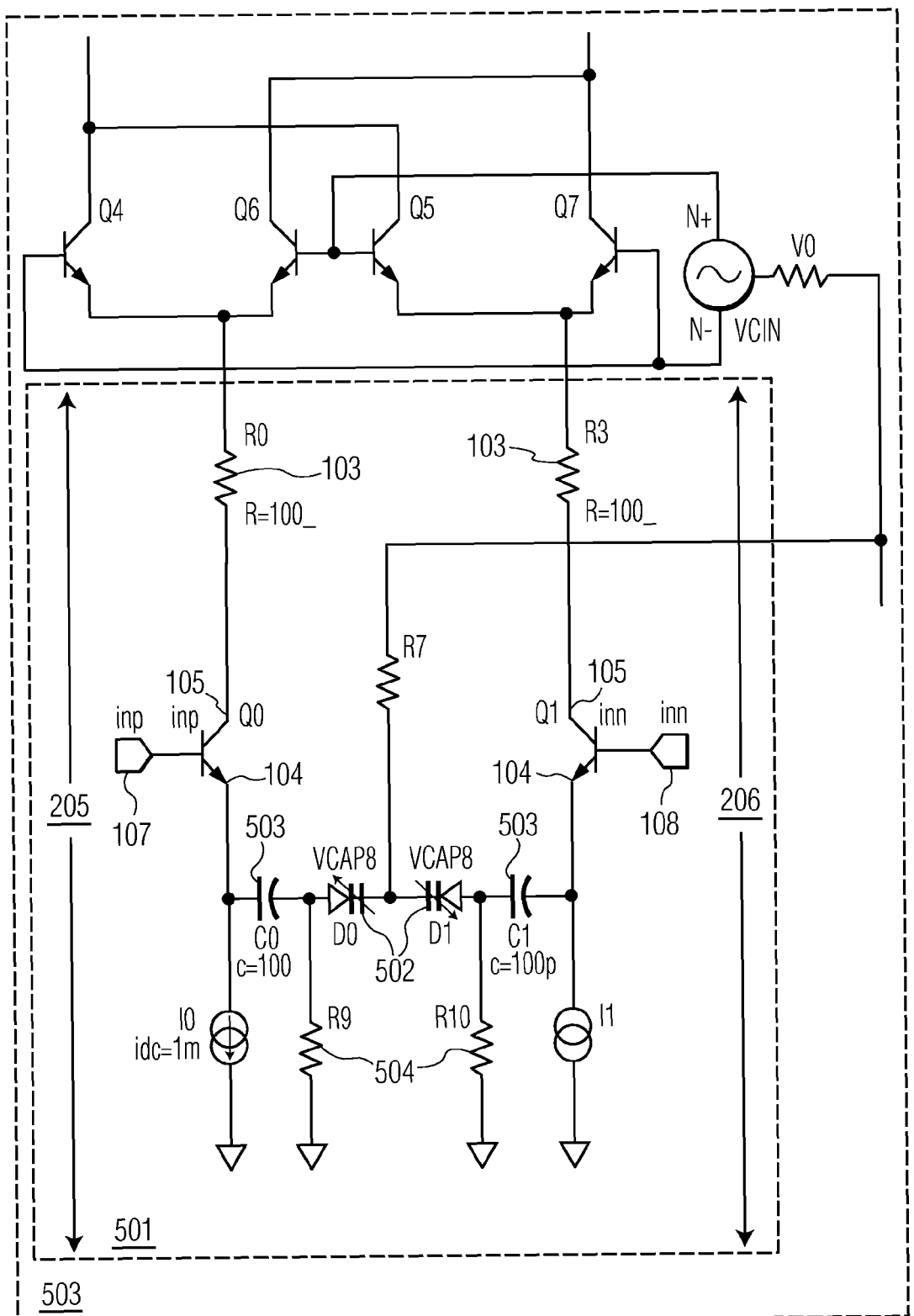
FIG. 5 illustrates an RF front end for a wide band receiver modified according to the present invention.

Referring now to FIG. 5, illustrated therein is an RF front-end part of a wide band receiver. In the lower stage of the double balanced mixer 505 the low-power high dynamic range input stage 501 of the present invention is applied. In this application of the present invention, between the emitters 104 two variable capacitance diodes 502 are connected via two fixed series capacitors 503. Furthermore, the anode of the diodes is connected to the ground via a resistor 504 in order to obtain a DC path to the ground. Therefore, the anodes of the variable capacitance diodes are biased at a fixed 0V DC level. Consequently, a higher range of the capacitance variation is obtained, so the gain can be kept constant over a wider input frequency range. In order to avoid parasitic oscillations in the gain stage by the capacitive load of the emitters 104, two 100Ω resistors 103 are connected in series with the collector leads of transistors 101.

This new stage can be used in amplifiers, but also in the lower stage of double balanced mixers commonly used in RF receivers, as illustrated in FIGS. 3, 4, 5.

Finally, it is possible to use other components for the amplification and degeneration components, e.g., a field effect transistor (FET), in place of a bipolar transistor. In the FET case the Noise Figure (NF) increases to 5 dB because of the lower transconductance of an FET compared with a bipolar transistor having the same tail current. Further, the $3^{rd}$ order intercept point increases and is higher than 118 dBµV (peak). In the case where the first and second differential input amplification component is a field effect transistor (FET), each has an internal gate series resistance $R_g$ and a small signal source resistance $r_s$ such that $r_s$ is $1/g_m$, where $g_m$ is the transconductance of the FET. A first and second drain resistor is respectively connected to a first and second drain of the first and second FET. A noiseless degeneration component is connected between a first and second source, respectively, of the first and second FET, and the contribution to the noise level of the input stage is calculated as the sum of the two internal gate series resistors $R_g$ plus two times the small signal source resistance of $r_s$.

While the preferred embodiments of the present invention have been illustrated and described, it will be understood by those skilled in the art that the management frame, device architecture and methods as described herein are illustrative and various changes and modifications may be made and equivalents may be substituted for elements thereof without departing from the true scope of the present invention. In addition, many modifications may be made to adapt the teachings of the present invention to a particular situation without departing from its central scope, i.e., using a field effect transistor (FET) instead of a bipolar transistor. Therefore, it is intended that the present invention not be limited to the particular embodiments disclosed as the best mode contemplated for carrying out the present invention, but that the present invention include all embodiments falling within the scope of the appended claims.

The invention claimed is:

1. A double balanced mixer for an FM broadcast receiver, comprising:
    a lower stage including a low-power high dynamic range input stage comprising:
        first and second differential input transistors connected to a differential input signal, each transistor having an internal base resistance of $R_b$ and a small signal emitter resistance of $r_e$;
        a first and second collector resistor respectively coupled to a first and second collector of the first and second differential transistor; and
        an emitter degeneration component connected between a first and second emitter, respectively, of the first and second differential transistor, wherein the emitter degeneration component does not include a resistor,
    wherein the first and second collector resistor each have a value of 100 ω to avoid parasitic oscillations.

2. The mixer of claim 1, wherein: the emitter degeneration component is a capacitor that contributes no noise to the input stage; and the noise contribution of the input stage is determined by the sum of the two internal base resistors $R_b$ and two times half the small signal emitter resistance of $r_e$.

3. The mixer of claim 1, wherein: the differential input stage comprises a differential input topology having a first and second signal path side; the first and second transistors and resistors are arranged respectively in the first and second signal path side such that they are symmetrical with respect to each other; and a circuit that is laid out such that the current paths of the first and second signal path side of the differential topology are identical to each other.

4. A double balanced mixer for UHF part of a television set, comprising:
    an upper stage; and
    a double balanced mixer according to claim 1, wherein the emitter degeneration component comprises two variable capacitance diodes and a control voltage for the two variable capacitance diodes is the same as a tuning voltage for a local oscillator that drives the upper stage, and wherein the first and second collector resistor each have a value of 100ω to avoid parasitic oscillations.

5. A receiver, comprising a receiver front end including a double balanced mixer according to claim 4 wherein the receiver does not include a low noise amplifier LNA prior to the differential input stage is eliminated.

6. A low-power high dynamic range differential input stage, comprising:
   first and second differential input transistors connected to a differential input signal, each transistor having an internal base resistance of $R_b$ and a small signal emitter resistance of $r_e$;
   a first and second collector resistor respectively coupled to a first and second collector of the first and second differential transistor; and
   an emitter degeneration component connected between a first and second emitter, respectively, of the first and second differential transistor;
   wherein: a noise figure of the differential input stage is less than 3 dB; a product of an impedance between the first and second emitter multiplied by a tail current is such that a high $3^{rd}$ order input intercept point is 118 dBµV; and power consumption of the differential input stage is ⅕ relative to another differential input stage with the high dynamic range and an emitter degeneration component that includes two resistors connected between differential transistors and a current source.

7. The differential input stage of claim 6, wherein the impedance between the first and second emitter is 10 pF, the tail current is 2 mA, a frequency is 106 MHz such that a $3^{rd}$ order input intercept point is 118 dBµV.

8. The differential input stage of claim 6, wherein the impedance between the first and second emitter is 10 pF, the tail current is 10 mA, a frequency is 106 MHz such that a $3^{rd}$ order input intercept point is 136 dBµV.

9. A double balanced mixer for an FM broadcast receiver, comprising a lower stage including a low-power high dynamic range input stage according to claim 6, wherein the first and second collector resistor each have a value of 100ω to avoid parasitic oscillations.

10. A receiver, comprising a receiver front end including a double balanced mixer according to claim 9 wherein the receiver does not include a low noise amplifier LNA prior to the differential input stage.

11. A double balanced mixer for an RF front-end part of a wide-band receiver, comprising:
   a lower stage including a low-power high dynamic range input stage that includes first and second differential input transistors connected to a differential input signal, each transistor having an internal base resistance of $R_b$ and a small signal emitter resistance of $r_e$;
   a first and second collector resistor respectively coupled to a first and second collector of the first and second differential transistor; and
   an emitter degeneration component that is connected between a first and second emitter, respectively, of the first and second differential transistor, wherein:
   i. the emitter degeneration component comprises a first and second variable capacitance diode biased at a fixed 0 V DC level, connected back-to-back in series with each other and respectively connected to the first and second emitter via a first and second fixed series capacitor; and
   ii. the first and second collector resistor each have a value of 100ω to avoid parasitic oscillations.

12. The double balanced mixer of claim 11, wherein an anode of the first and second variable capacitance diode is connected to the ground via a resistor in order to obtain a DC path to the ground such that the first and second variable capacitance diodes are biased at a fixed 0V DC level.

13. A receiver, comprising a receiver front end including a differential input stage according to claim 11 wherein the receiver does not include a low-noise amplifier LNA prior to the differential input stage is eliminated.

14. A method for manufacturing a low power consumption and high dynamic range differential input stage, comprising the steps of:
   providing a first and second differential input transistor each having an internal base resistance of $R_b$ and a small signal emitter resistance of $r_e$;
   connecting the provided first and second differential input transistor to a first and second differential input signal;
   connecting a first and second collector resistor respectively to a first and second collector of the first and second differential transistor;
   providing an emitter degeneration component by providing a capacitor that contributes no noise to the input stage; and calculating the contribution to the noise level of the input stage as the sum of the two base resistors $R_b$ and two times half the small signal emitter resistance of $r_e$; and
   connecting the emitter degeneration component between a first and second emitter, respectively, of the first and second differential transistor, wherein emitter degeneration component is configured and arranged without a resistor between the first and second emitter,
   wherein: a noise figure is less than 3 dB; the product of an impedance between the first and second emitter multiplied by a tail current is such that a high $3^{rd}$ order input intercept point is 118 dBµV.

15. The method of claim 14, wherein the impedance between the first and second emitter is 10 pF, the tail current is 2 mA, a frequency is 106 MHz such that a $3^{rd}$ input intercept point is 118 dBµV.

16. The method of claim 14, wherein the impedance between the first and second emitter is 10 pF, the tail current is 10 mA, a frequency is 106 MHz such that a $3^{rd}$ order input intercept point is 136 dBµV.

17. A method for manufacturing a low power consumption and high dynamic range differential input stage, comprising the steps of:
   providing a first and second differential input amplification component, wherein the first and second differential input amplification component is a field effect transistor FET having an internal gate series resistance $R_g$ and a small signal source resistance $r_s$, wherein $r_s$ is $1/g_m$ and $g_m$ is the transconductance of the FET; and further comprising the steps of: a. connecting a first and second drain resistor respectively to a first and second drain of the first and second FET; b. connecting the noiseless degeneration component between a first and second source, respectively, of the first and second FET, and c. calculating the contribution to the noise level of the input stage as the sum of the two internal gate series resistors $R_g$ and two times the small signal source resistance of $r_s$;
   connecting the provided first and second differential input amplification component to a differential input signal; and connecting a noiseless component between the first and second differential input amplifier component to achieve a predictable gain,
wherein: a noise figure of the input stage is less than 5 dB; the product of an impedance between the first and second source multiplied by a tail current is such that a high $3^{rd}$ order input intercept point is higher than 118 dBµV.

18. The method of claim 17, wherein the impedance between the first and second source is 10 pF, the tail current is 2 mA, a frequency is 106 MHz such that a $3^{rd}$ input intercept point is higher than 118 dBµV.

* * * * *